United States Patent
Gross et al.

(10) Patent No.: US 10,860,011 B2
(45) Date of Patent: Dec. 8, 2020

(54) USING A DIGITAL TWIN TO FACILITATE ENVIRONMENT-SPECIFIC PROGNOSTIC-SURVEILLANCE OPERATIONS FOR ENGINEERING ASSETS IN THE FIELD

(71) Applicant: Oracle International Corporation, Redwood Shores, CA (US)

(72) Inventors: Kenny C. Gross, Escondido, CA (US); Guang C. Wang, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 144 days.

(21) Appl. No.: 16/371,694

(22) Filed: Apr. 1, 2019

(65) Prior Publication Data
US 2020/0310396 A1    Oct. 1, 2020

(51) Int. Cl.
*G05B 23/02* (2006.01)
*G06F 30/20* (2020.01)

(52) U.S. Cl.
CPC ..... *G05B 23/0205* (2013.01); *G05B 23/0243* (2013.01); *G06F 30/20* (2020.01)

(58) Field of Classification Search
CPC .................................................. G05B 23/0205
See application file for complete search history.

(56) References Cited

U.S. PATENT DOCUMENTS

2019/0138423 A1\* 5/2019 Agerstam ............ G06N 3/0445

\* cited by examiner

*Primary Examiner* — Mark A Connolly
(74) *Attorney, Agent, or Firm* — Park, Vaughan, Fleming & Dowler LLP

(57) ABSTRACT

During operation, the system receives time-series signals from sensors in the asset while the asset is operating. Next, the system obtains real-time environmental parameters for an environment in which the asset is operating. The system then selects an environment-specific inferential model for the asset based on the real-time environmental parameters, wherein the environment-specific inferential model was trained on a golden system while the golden system was operating in an environment that matches the real-time environmental parameters. Next, the system uses the environment-specific inferential model to generate estimated values for the received time-series signals based on correlations among the received time-series signals, and performs a pairwise-differencing operation between actual values and the estimated values for the received time-series signals to produce residuals. Finally, the system determines from the residuals whether the asset is operating correctly.

20 Claims, 4 Drawing Sheets

USING A DIGITAL TWIN TO FACILITATE ENVIRONMENT-SPECIFIC PROGNOSTIC-SURVEILLANCE OPERATIONS FOR ENGINEERING ASSETS IN THE FIELD

BACKGROUND

Field

The disclosed embodiments generally relate to prognostic-surveillance techniques for monitoring engineering assets. More specifically, the disclosed embodiments relate to a prognostic-surveillance technique, which uses a digital twin to facilitate environmental-condition-specific prognostic-surveillance operations for complex engineering assets in the field.

Related Art

"Digital twin technology" has proved to be an effective technique for comparing the performance of an engineering asset in a research facility with the performance of the same asset (a "twin") in the field. For many types of assets, having a digital twin in a research facility can be quite valuable. For example, if an asset in the field will be: exercised through a new range-of-motion; pushed to a higher demand profile; or run with a new performance setting, it is advantageous to first apply the new settings to a digital twin in the laboratory to determine whether problems will arise in the new performance range. This provides assurance that the asset in the field will operate successfully using the same settings that were already validated by the digital twin in the research facility.

Researchers have recently attempted to extend the use of digital twins for prognostic-surveillance purposes. This involves monitoring time-series sensor signals from an asset in the field, and then comparing the monitored signals with signals obtained from a digital twin asset in a research facility. This comparison facilitates detecting deviations that can indicate aging or other degradation in internal components of the asset in the field, or other performance-related issues.

However, a significant challenge arises while using this technique to perform prognostic-surveillance operations for assets located in outdoor environments (as opposed to in temperature-controlled buildings). This is because assets in outdoor environments often experience large variations in ambient temperature, humidity and altitude. These variations can cause performance problems, which will not be reflected in the performance of a digital twin located in an indoor environment. For example, changing temperatures can cause metal parts to expand and contract, changing friction factors for mechanical systems, and can cause lubrication to not work optimally. For hydraulic systems, changing temperatures can cause fluids to change volumes, viscosities, dissolved gas content, and other chemical properties. Also, increased humidity can cause micro-condensation to form on cold metallic surfaces, and higher altitudes can reduce the effectiveness of cooling fans, altering internal component temperatures.

Hence, what is needed is a technique for performing prognostic-surveillance operations for assets located in outdoor environments, which accounts for performance variations arising from changes in atmospheric conditions.

SUMMARY

The disclosed embodiments provide a system that performs environment-specific prognostic-surveillance operations for an asset in the field. During operation, the system receives time-series signals from sensors in the asset while the asset is operating. Next, the system obtains real-time environmental parameters for an environment in which the asset is operating. The system then selects an environment-specific inferential model for the asset based on the real-time environmental parameters, wherein the environment-specific inferential model was trained on a golden system while the golden system was operating in an environment that matches the real-time environmental parameters, wherein a configuration of the golden system matches a configuration of the asset, and wherein the golden system was certified to be operating correctly. Next, the system uses the environment-specific inferential model to generate estimated values for the received time-series signals based on correlations among the received time-series signals, and performs a pairwise-differencing operation between actual values and the estimated values for the received time-series signals to produce residuals. Finally, the system determines from the residuals whether the asset is operating correctly.

In some embodiments, while determining from the residuals whether the asset is operating correctly, the system first performs a sequential probability ratio test (SPRT) on the residuals to produce SPRT alarms. Next, the system determines from the SPRT alarms whether the asset is operating correctly.

In some embodiments, prior to receiving the time-series signals, the system generates a set of environment-specific inferential models. During this process, the system gathers environment-specific time-series signals from the golden system while the golden system operates in an environmental-testing facility, which is cycling through different combinations of environmental parameters. Next, the system trains a different environment-specific inferential model using time-series signals for each of the different combinations of environmental parameters. Finally, the system stores all of the different environment-specific inferential models to facilitate subsequent environment-specific prognostic-surveillance operations.

In some embodiments, while using the environment-specific inferential model to generate the estimated values for the received time-series signals, the system generates estimated values for a sliding time window of values for the received time-series signals. The system then uses a telemetry parameter synthesis (TPSS) technique to project the estimated values for the received time-series signals into the future based on the time window. Finally, the system performs a pairwise-differencing operation between the projected estimated values and the actual values for the received time-series signals.

In some embodiments, the real-time environmental parameters include one or more of the following: an ambient temperature; a relative humidity; and an altitude.

In some embodiments, the asset comprises a component in a power-generation system, or a component in a power-transmission system.

In some embodiments, the inferential model comprises a Multivariate State Estimation Technique (MSET) model.

DETAILED DESCRIPTION

Figure 1:
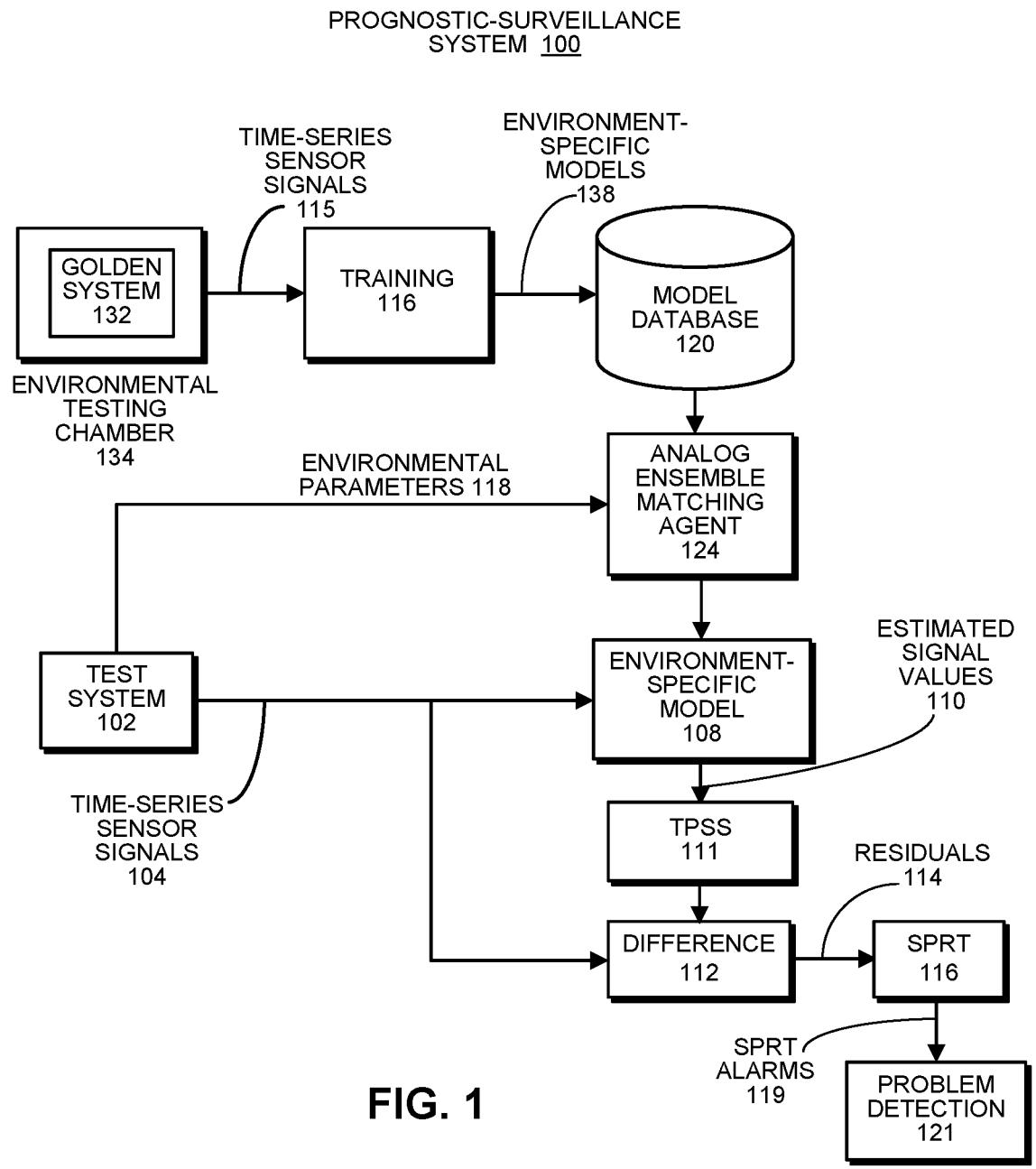
FIG. 1 illustrates a prognostic-surveillance system in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Effects of Environmental Parameters

Environmental parameters, such as ambient temperature, relative humidity and altitude, can greatly affect the operation of an asset in the field. For example, as temperatures of internal components and subsystems increase, thermal cycling can greatly affect the reliability of system internals. Many degradation mechanisms are accelerated by thermal cycling at elevated temperatures, including: accelerated solder fatigue; interconnect fretting; differential thermal expansion between bonded materials (which can lead to delamination failures); thermal mismatches between mating surfaces; differentials in the coefficients of thermal expansion between materials used in embedded-control packages; wire bond shear and flexure fatigue; passivation cracking; electromigration failures; electrolytic corrosion; thermomigration failures; crack initiation and propagation; delamination between chip dies and molding compounds (as well as between molding compounds and lead frames); die deadhesion fatigue; repeated stress reversals in brackets leading to dislocations, cracks, and eventual mechanical failures; deterioration of MPI connectors through elastomeric stress relaxation in polymers; and others.

Although ambient relative humidity can directly affect long-term aging phenomena for mechanical assets that do not contain embedded control elements (for example, through accelerated surface corrosion of metallic components and accelerated oxidation degradation of elastomeric elements), for the majority of electromechanical components and subsystems, variations in relative humidity can have a more pronounced impact on aging and degradation mechanisms. This is because high relative humidity in conjunction with thermal swings leads to micro-condensation, which can cause shorting of interconnects and accelerated electromigration failures in PCB elements, and accelerated surface corrosion that leads to resistive failures in interconnects, as well as increased friction in all types of shaft-sleeve and rotating machinery components.

Altitude can also affect electronic, electromechanical, and propulsion assets that require internal cooling fans because there is a significant difference in the cooling capability of air near sea level versus at high elevation (for example in Denver, Colo., which is one mile above sea level). Because of the differences in the cooling capacity of air at different altitudes and the resulting differences in cooling fan speeds, the thermal dynamics and vibrational states of assets can be significantly different for identical assets located at different altitudes.

System Operation

The disclosed embodiments operate by first gathering time-series sensor signals from a "golden system," which is configured to match a configuration of an asset to be monitored. (This "golden system" is an asset that contains new and/or thoroughly tested components with no degradation modes, and which is operating as well as can be expected for that asset.) More specifically, we gather environment-specific time-series signals from the golden system while the golden system operates in an environmental-testing chamber, which cycles through all possible combinations of various environmental parameters, such as ambient temperature, relative humidity and altitude, while time-series signals are collected from sensors in the golden system. For example, the ambient temperature can be varied between −20° C. and 80° C. in 5-degree increments, the relative humidity can be varied between 5% and 95% in 5% increments, and the altitude can be varied between sea level and 10,000 feet in 2,000 foot increments. (Note that, in addition to ambient temperature, relative humidity and altitude, the disclosed embodiments can also vary other environmental parameters, such as ambient vibrations and ambient radiation.)

Next, we train a different environment-specific inferential model based on time-series signals for each of the different combinations of environmental parameters. In some embodiments, this inferential model is an MSET model. However, other types of nonlinear, nonparametric regression-based machine-learning models can also be used, such as neural nets and support vector machines.

Next, for any "twin" asset in the field, we monitor time-series telemetry signals from the same sensors as those in the golden system in real time. We then measure analog predictors associated with environmental parameters for the asset in the field, such as ambient temperature, relative humidity and altitude. Next, we send these analog predictors to an analog ensemble matching agent (AEMA), which infers the real-time environmental parameters for the asset in the field. The AEMA then analyzes the analog predictors to look for a closeness of match to models in a pre-built library using a linear-optimization technique, which minimizes Euclidean distances between the analog predictors and corresponding environment-specific models in the model library.

The AEMA then selects and actuates a corresponding pre-trained environment-specific inferential model from the model library. In this way, a large number of assets in the field can be monitored using twin-specific and environment-specific inferential models to facilitate sensitive detection of aging-related or performance-related degradation modes with high prognostic sensitivity, and low false alarm rates.

We then use the environment-specific inferential model to generate estimated values for time-series signals received from the asset in the field based on correlations among the received time-series signals from the asset in the field. This can involve using a "receding time horizon" scheme, which depends on a time window having a length that is correlated with a forecast horizon of interest. For example, starting from $T=T_0$, we take a time window (e.g., two hours) of ground truth signals (from the pre-trained models in the environmental-testing facility) and send them to an inferential model to produce estimates for the received time-series signals. We then use the TPSS technique to project the estimates for the received time-series signals into the future using a moving window structure, which advances ahead one observation at a time but is always "looking ahead" two hours into the future.

We then perform a pairwise-differencing operation between the projected-ahead estimated values and the actual values for the received time-series signals to produce residuals. Finally, we perform a SPRT on the residuals to detect possible degradation. If any degradation is detected, we can set data disturbance flags for any affected signals, and can prepare for a scheduled shutdown if an imminently dangerous system state is predicted with a high confidence factor. Or, we can notify maintenance personnel to proactively schedule service actions at the earliest convenient time. We then continue sampling the signals by sliding the time window forward in units of signal sampling rate. This process continuously iterates to provide real-time assurance that assets in the field are operating within all reliability, availability, and serviceability (RAS) functional specifications, and to facilitate real-time detection of the onset of incipient degradation to facilitate avoiding catastrophic failures of assets in the field.

Prognostic-Surveillance System

FIG. 1 illustrates an exemplary prognostic-surveillance system 100, which uses an environment-specific inferential model 108 to monitor time-series sensor signals 104 from a test system 102. Test system 102 can generally include any type of machinery or facility, which includes sensors and generates time-series signals. Moreover, time-series signals 104 can originate from any type of sensor located in test system 102, including, but not limited to: a voltage sensor; a current sensor; a pressure sensor; a rotational-speed sensor; and a vibration sensor.

During a training phase, the system obtains time-series sensor signals 115 from a golden system 132, which is operating inside an environmental testing chamber 134, wherein the configuration of this golden system 132 matches a configuration of test system 102. Moreover, golden system 132 is ensured to be operating correctly and contains new and/or thoroughly tested components with no degradation. During the training phase, environmental-testing chamber 134 cycles through different combinations of environmental parameters, which enables training module 116 to train environment-specific inferential models 138 for each of the different combinations of the environmental parameters. These environment-specific inferential models 138 are then stored in a model database 120.

During a subsequent monitoring phase, environmental parameters 122 (e.g., ambient temperature, relative humidity and altitude) are obtained from sensors in proximity to test system 102, and these environmental parameters 118 are used by analog ensemble matching agent (AEMA) 124 to select an environment-specific model 108, which is used to analyze time-series sensor signals 104 gathered from test system 102.

During the surveillance mode, time-series signals 104 feed from test system 102 into environment-specific model 108, which for example can be an MSET model. Although it is advantageous to use MSET for pattern-recognition purposes, the disclosed embodiments can generally use any one of a generic class of pattern-recognition techniques called nonlinear, nonparametric (NLNP) regression, which includes neural networks, support vector machines (SVMs), auto-associative kernel regression (AAKR), and even simple linear regression (LR).

Environment-specific model 108 predicts what each signal will be, based on other correlated variables to form estimated signal values 110. The system then uses a TPSS module 111 to project the estimated signal values 110 for the received time-series signals into the future based on a time window. Next, the system uses a difference module 112 to perform a pairwise-differencing operation between the actual signal values and the estimated signal values to produce residuals 114.

The system then performs a "detection operation" on the residuals 114 by using SPRT module 116 to detect anomalies, and possibly to generate SPRT alarms 119. (For a description of the SPRT model, please see Wald, Abraham, June 1945. "Sequential Tests of Statistical Hypotheses." *Annals of Mathematical Statistics*. 16 (2): 117-186.) These SPRT alarms 119 feed into a problem detection module 121, which facilitates real-time detection of incipient degradation, and can notify service personnel to perform proactive maintenance operations to avoid catastrophic failures of assets in the field.

Performing Prognostic-Surveillance Operations

Figure 2:
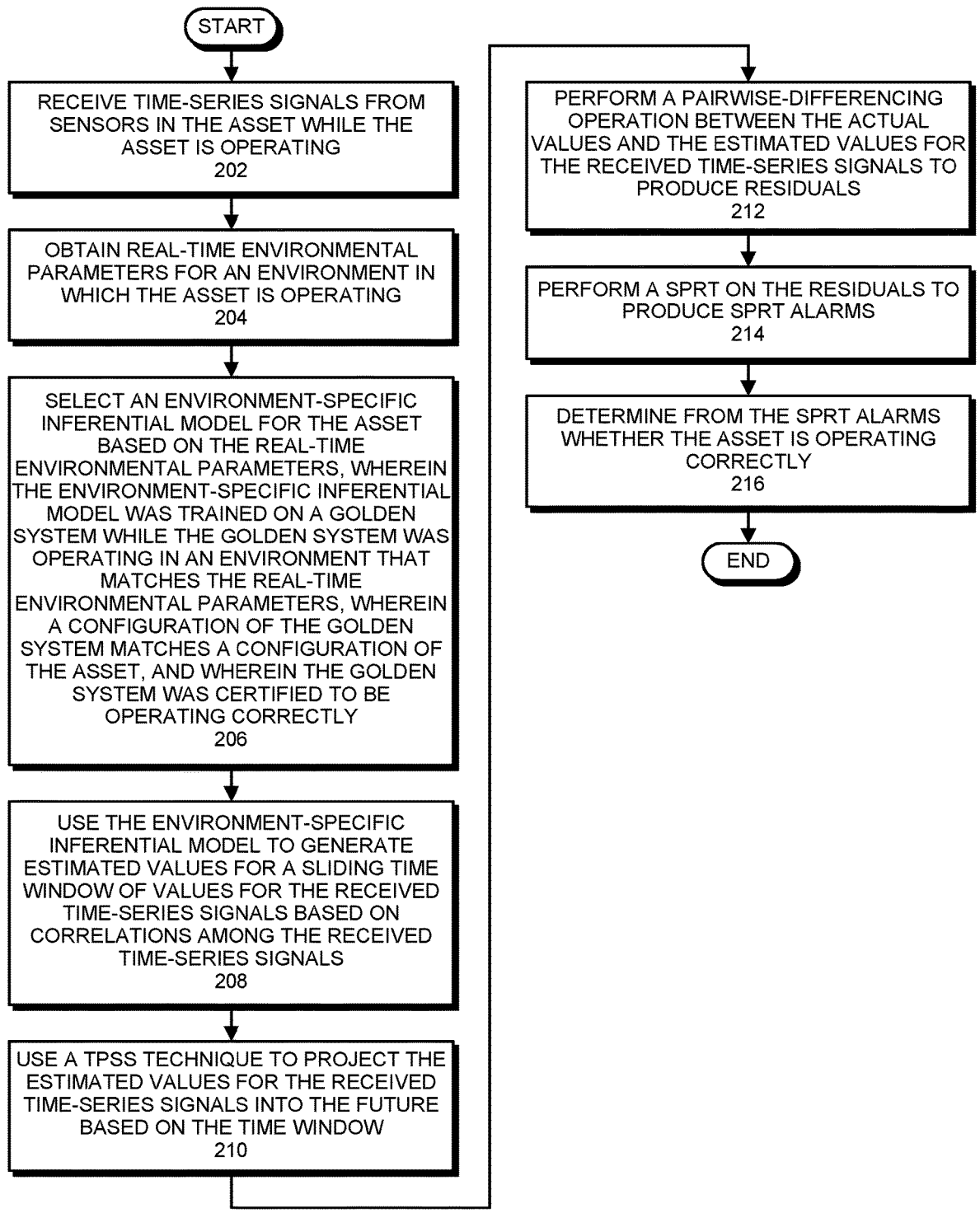
FIG. 2 presents a flow chart illustrating a method for performing prognostic-surveillance operations based on an environment-specific inferential model in accordance with the disclosed embodiments.

FIG. 2 presents a flow chart illustrating the process of performing prognostic-surveillance operations based on an environment-specific inferential model in accordance with the disclosed embodiments. During operation, the system receives time-series signals from sensors in the asset while the asset is operating (step 202). Next, the system obtains real-time environmental parameters for an environment in which the asset is operating (step 204). (Note that these real-time environmental parameters can either be directly measured or inferred from other parameters.) The system then selects an environment-specific inferential model for the asset based on the real-time environmental parameters, wherein the environment-specific inferential model was trained on a golden system while the golden system was operating in an environment that matches the real-time environmental parameters, wherein a configuration of the golden system matches a configuration of the asset, and wherein the golden system was certified to be operating correctly (step 206). The system then uses the environment-specific inferential model to generate estimated values for a sliding time window of values for the received time-series signals based on correlations among the received time-series signals (step 208). Next, the system uses the TPSS technique to project the estimated values for the received time-series signals into the future based on the time window (step 210), and then performs a pairwise-differencing operation between the actual values and the estimated values for the received time-series signals to produce residuals (step 212). Next, the system performs a SPRT on the residuals to produce SPRT alarms (step 214). Finally, the system determines from the SPRT alarms whether the asset is operating correctly (step 216).

Figure 3:
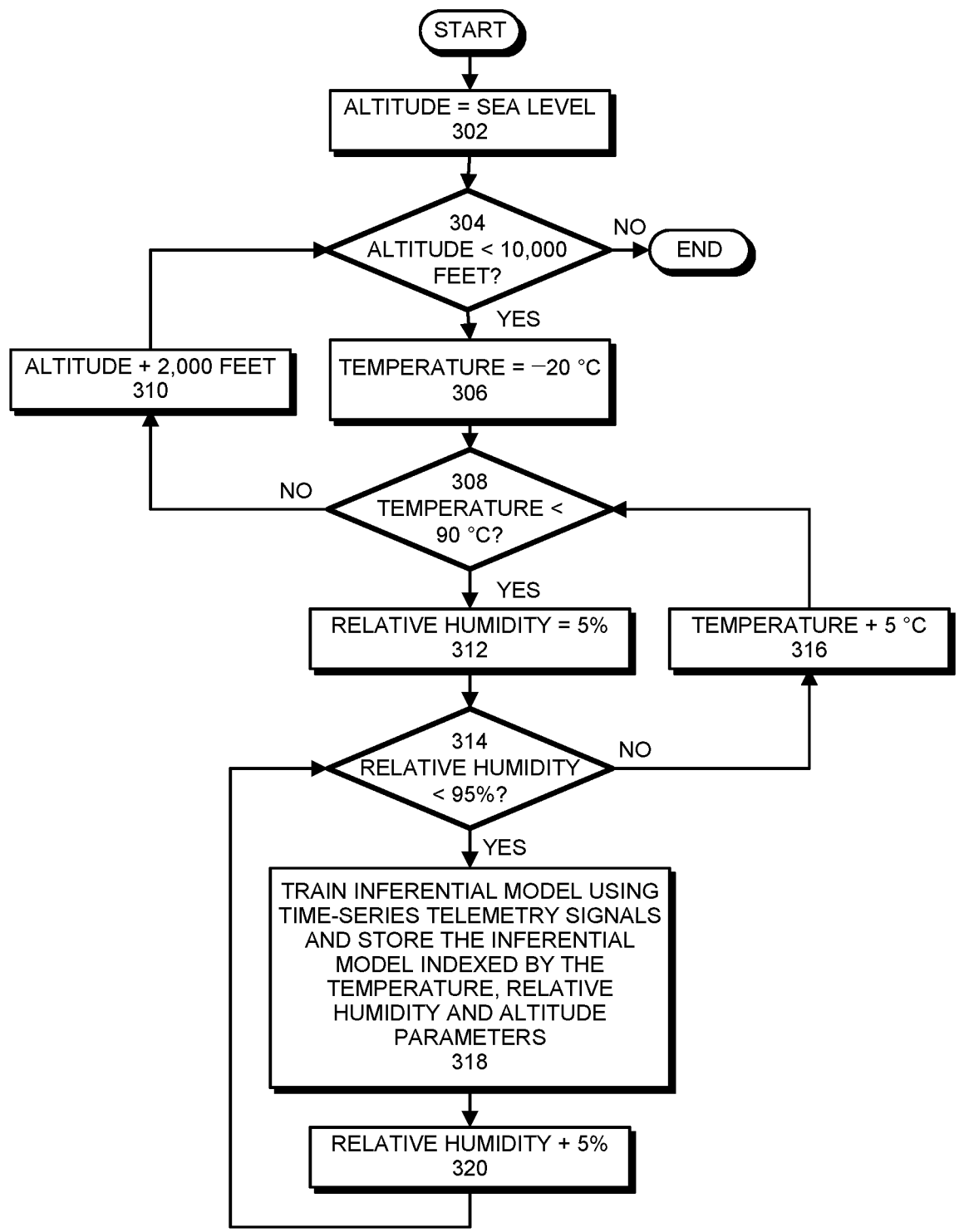
FIG. 3 presents a flow chart illustrating the process of systematically testing a golden system across a range of operating environments in accordance with the disclosed embodiments.

FIG. 3 presents a flow chart illustrating a method for systematically testing a golden system across a range of operating environments in accordance with the disclosed embodiments. (This flowchart provides details about the process of training a set of environment-specific inferential models on a golden system, wherein one of these environment-specific inferential models is selected in step 206 in the flowchart in FIG. 2.) The system starts by initializing the altitude variable to sea level (step 302). Next, the system determines whether the altitude is less than 10,000 feet (step 304). If not (NO at step 304), the process completes; otherwise (YES at step 304), the system initializes the temperature variable to be −20° C. (step 306). The system then determines whether the temperature is less than 90° C. (step 308). If not (NO at step 308), the system increases the altitude by 2,000 feet (step 310) and returns to step 304; otherwise (YES at step 308), the system initializes the relative humidity variable to be 5% (step 312). The system then determines whether the relative humidity is less than 95% (step 314). If not (NO at step 314), the system increases the temperature by 5° C. (step 316) and returns to step 308. Otherwise (YES at step 314), the system trains an inferential model based on the time-series telemetry signals, and stores the inferential model indexed by the temperature, relative humidity and altitude parameters (step 318). The system then increases the relative humidity by 5% (step 320) and returns to step 314.

Figure 4:
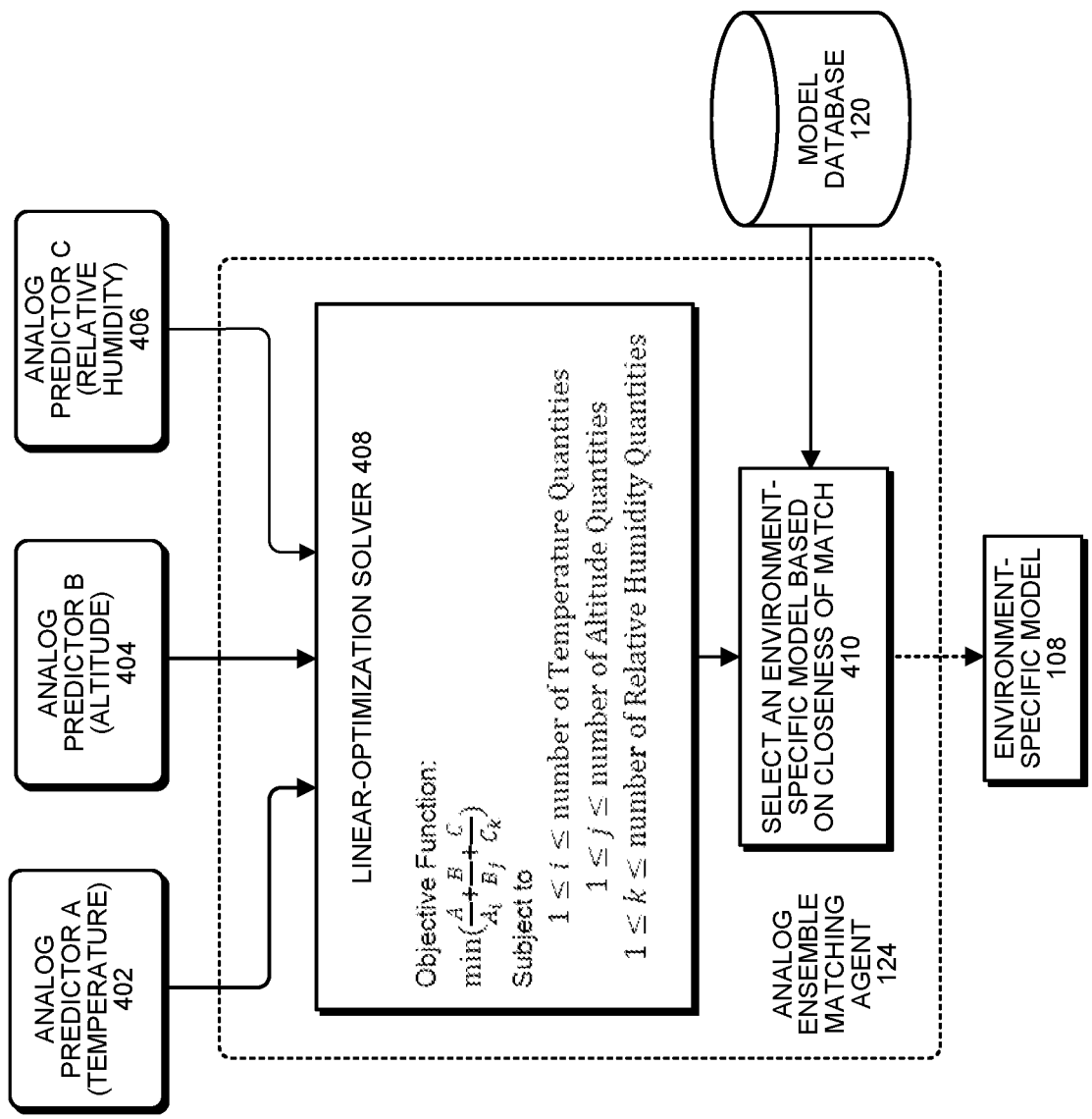
FIG. 4 presents a diagram illustrating the structure of an analog ensemble matching agent in accordance with the disclosed embodiments.

FIG. 4 presents a diagram illustrating the structure of analog ensemble matching agent (AEMA) 124 in accordance with the disclosed embodiments. As illustrated in FIG. 4, AEMA 124 receives a number of analog predictors, namely analog predictor A (temperature) 402, analog predictor B (altitude) 404, and analog predictor C (relative humidity) 406, and uses a linear-optimization solver 408 to solve the objective function illustrated in FIG. 4. This enables AEMA 124 to perform step 410 to select an environment-specific model 108 from model database 120 based on closeness of match.

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for performing environment-specific prognostic-surveillance operations for an asset, comprising:
   receiving time-series signals from sensors in the asset while the asset is operating;
   obtaining real-time environmental parameters for an environment in which the asset is operating;
   selecting an environment-specific inferential model for the asset based on the real-time environmental parameters, wherein the environment-specific inferential model was trained on a golden system while the golden system was operating in an environment that matches the real-time environmental parameters, wherein a configuration of the golden system matches a configuration of the asset, and wherein the golden system was certified to be operating correctly;
   using the environment-specific inferential model to generate estimated values for the received time-series signals based on correlations among the received time-series signals;
   performing a pairwise-differencing operation between actual values and the estimated values for the received time-series signals to produce residuals; and
   determining from the residuals whether the asset is operating correctly.

2. The method of claim 1, wherein determining from the residuals whether the asset is operating correctly involves:
   performing a sequential probability ratio test (SPRT) on the residuals to produce SPRT alarms; and
   determining from the SPRT alarms whether the asset is operating correctly.

3. The method of claim 1, wherein prior to receiving the time-series signals, the method further comprises generating a set of environment-specific inferential models by:
   gathering environment-specific time-series signals from the golden system while the golden system operates in an environmental-testing facility, which is cycling through different combinations of environmental parameters;
   training a different environment-specific inferential model using time-series signals for each of the different combinations of environmental parameters; and
   storing the different environment-specific inferential models to facilitate subsequent environment-specific prognostic-surveillance operations.

4. The method of claim 1,
   wherein using the environment-specific inferential model to generate the estimated values for the received time-series signals involves generating estimated values for a sliding time window of values for the received time-series signals;
   wherein the method further comprises using a telemetry parameter synthesis (TPSS) technique to project the estimated values for the received time-series signals into the future based on the time window; and
   wherein the pairwise-differencing operation is performed between the projected estimated values and the actual values for the received time-series signals.

5. The method of claim 1, wherein the real-time environmental parameters include one or more of the following:
   an ambient temperature;
   a relative humidity; and
   an altitude.

6. The method of claim 1, wherein the asset comprises one of the following:
   a component in a power-generation system; and
   a component in a power-transmission system.

7. The method of claim 1, wherein the inferential model comprises a Multivariate State Estimation Technique (MSET) model.

8. A non-transitory, computer-readable storage medium storing instructions that when executed by a computer cause the computer to execute a method for performing environment-specific prognostic-surveillance operations for an asset, the method comprising:
receiving time-series signals from sensors in the asset while the asset is operating;
obtaining real-time environmental parameters for an environment in which the asset is operating;
selecting an environment-specific inferential model for the asset based on the real-time environmental parameters, wherein the environment-specific inferential model was trained on a golden system while the golden system was operating in an environment that matches the real-time environmental parameters, wherein a configuration of the golden system matches a configuration of the asset, and wherein the golden system was certified to be operating correctly;
using the environment-specific inferential model to generate estimated values for the received time-series signals based on correlations among the received time-series signals;
performing a pairwise-differencing operation between actual values and the estimated values for the received time-series signals to produce residuals; and
determining from the residuals whether the asset is operating correctly.

9. The non-transitory, computer-readable storage medium of claim 8, wherein determining from the residuals whether the asset is operating correctly involves:
performing a SPRT on the residuals to produce SPRT alarms; and
determining from the SPRT alarms whether the asset is operating correctly.

10. The non-transitory, computer-readable storage medium of claim 8, wherein prior to receiving the time-series signals, the method further comprises generating a set of environment-specific inferential models by:
gathering environment-specific time-series signals from the golden system while the golden system operates in an environmental-testing facility, which is cycling through different combinations of environmental parameters;
training a different environment-specific inferential model using time-series signals for each of the different combinations of environmental parameters; and
storing the different environment-specific inferential models to facilitate subsequent environment-specific prognostic-surveillance operations.

11. The non-transitory, computer-readable storage medium of claim 8,
wherein using the environment-specific inferential model to generate the estimated values for the received time-series signals involves generating estimated values for a sliding time window of values for the received time-series signals;
wherein the method further comprises using a TPSS technique to project the estimated values for the received time-series signals into the future based on the time window; and
wherein the pairwise-differencing operation is performed between the projected estimated values and the actual values for the received time-series signals.

12. The non-transitory, computer-readable storage medium of claim 8, wherein the real-time environmental parameters include one or more of the following:
an ambient temperature;
a relative humidity; and
an altitude.

13. The non-transitory, computer-readable storage medium of claim 8, wherein the asset comprises one of the following:
a component in a power-generation system; and
a component in a power-transmission system.

14. The non-transitory, computer-readable storage medium of claim 8, wherein the inferential model comprises an MSET model.

15. A system that performs environment-specific prognostic-surveillance operations for an asset, comprising:
at least one processor and at least one associated memory; and
a prognostic-surveillance mechanism that executes on the at least one processor, wherein during operation, the prognostic-surveillance mechanism:
receives time-series signals from sensors in the asset while the asset is operating;
obtains real-time environmental parameters for an environment in which the asset is operating;
selects an environment-specific inferential model for the asset based on the real-time environmental parameters, wherein the environment-specific inferential model was trained on a golden system while the golden system was operating in an environment that matches the real-time environmental parameters, wherein a configuration of the golden system matches a configuration of the asset, and wherein the golden system was certified to be operating correctly;
uses the environment-specific inferential model to generate estimated values for the received time-series signals based on correlations among the received time-series signals;
performs a pairwise-differencing operation between actual values and the estimated values for the received time-series signals to produce residuals; and
determines from the residuals whether the asset is operating correctly.

16. The system of claim 15, wherein while determining from the residuals whether the asset is operating correctly, the prognostic surveillance mechanism:
performs a sequential probability ratio test (SPRT) on the residuals to produce SPRT alarms; and
determines from the SPRT alarms whether the asset is operating correctly.

17. The system of claim 15, wherein prior to receiving the time-series signals, the prognostic-surveillance mechanism generates a set of environment-specific inferential models, during which process, the prognostic-surveillance mechanism:
gathers environment-specific time-series signals from the golden system while the golden system operates in an environmental-testing facility, which is cycling through different combinations of environmental parameters;
trains a different environment-specific inferential model using time-series signals for each of the different combinations of environmental parameters; and
stores the different environment-specific inferential models to facilitate subsequent environment-specific prognostic-surveillance operations.

18. The system of claim 15,
wherein while using the environment-specific inferential model to generate the estimated values for the received time-series signals, the prognostic-surveillance mechanism generates estimated values for a sliding time window of values for the received time-series signals;

wherein the prognostic-surveillance mechanism additionally uses a TPSS technique to project the estimated values for the received time-series signals into the future based on the time window; and wherein the pairwise-differencing operation is performed between the projected estimated values and the actual values for the received time-series signals.

19. The system of claim 15, wherein the real-time environmental parameters include one or more of the following:

an ambient temperature;

a relative humidity; and an altitude.

20. The system of claim 15, wherein the asset comprises one of the following:

a component in a power-generation system; and a component in a power-transmission system.

* * * * *

UNITED STATES PATENT AND TRADEMARK OFFICE
CERTIFICATE OF CORRECTION

| | | |
|---|---|---|
| PATENT NO. | : 10,860,011 B2 | Page 1 of 1 |
| APPLICATION NO. | : 16/371694 | |
| DATED | : December 8, 2020 | |
| INVENTOR(S) | : Gross et al. | |

It is certified that error appears in the above-identified patent and that said Letters Patent is hereby corrected as shown below:

In the Specification

In Column 6, Line 37, delete "1945." and insert -- 1945, --, therefor.

In the Claims

In Column 10, Line 44, in Claim 16, delete "prognostic surveillance" and insert -- prognostic-surveillance --, therefor.

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*